United States Patent [19]
Okayama et al.

[11] Patent Number: 6,127,718
[45] Date of Patent: Oct. 3, 2000

[54] SEMICONDUCTOR DEVICE AND METHOD OF MANUFACTURING THE SAME

[75] Inventors: Yasunori Okayama, Fujisawa; Hiroshi Ohtani, Yokohama, both of Japan

[73] Assignee: Kabushiki Kaisha Toshiba, Kawasaki, Japan

[21] Appl. No.: 09/146,682

[22] Filed: Sep. 3, 1998

[30] Foreign Application Priority Data

Sep. 8, 1997 [JP] Japan ..................................... 9-242830

[51] Int. Cl.⁷ ......................... H01L 29/00; H01L 21/8238
[52] U.S. Cl. .......................... 257/506; 257/500; 257/501; 257/512; 257/517; 438/207; 438/218; 438/219
[58] Field of Search ..................................... 257/500, 501, 257/505, 506, 511, 512, 517

*Primary Examiner*—David Hardy
*Assistant Examiner*—Jesse A Fenty
*Attorney, Agent, or Firm*—Banner & Witcoff, Ltd.

[57] ABSTRACT

The semiconductor device and method of manufacturing the same according to the present invention has an object of reducing hem-pulling at a side wall of an isolation trench caused at an open space of a device isolation region having a well boundary at its bottom portion thereby to prevent structurally occurrence of punch-through. In an insulator filled device isolation method, an isolation trench for device isolation is formed by dry etching. If a second isolation trench intersects an intermediate portion of a first isolation like a T-shape, one side of the first isolation trench has an open space. In this case, the inclination angle of the side wall of the first isolation trench, opposed to the open space, is loosened and the side wall forms a shape whose hem is pulled out on the bottom portion. In this case if a well boundary exists along the lengthwise direction at the bottom of the first isolation trench, the structure tends to cause punch-through easily. The present invention is characterized in that the second isolation trench intersecting the first isolation trench is inclined to reduce effectively the open space and to construct a structure in which hem-pulling of the side wall is reduced.

6 Claims, 8 Drawing Sheets

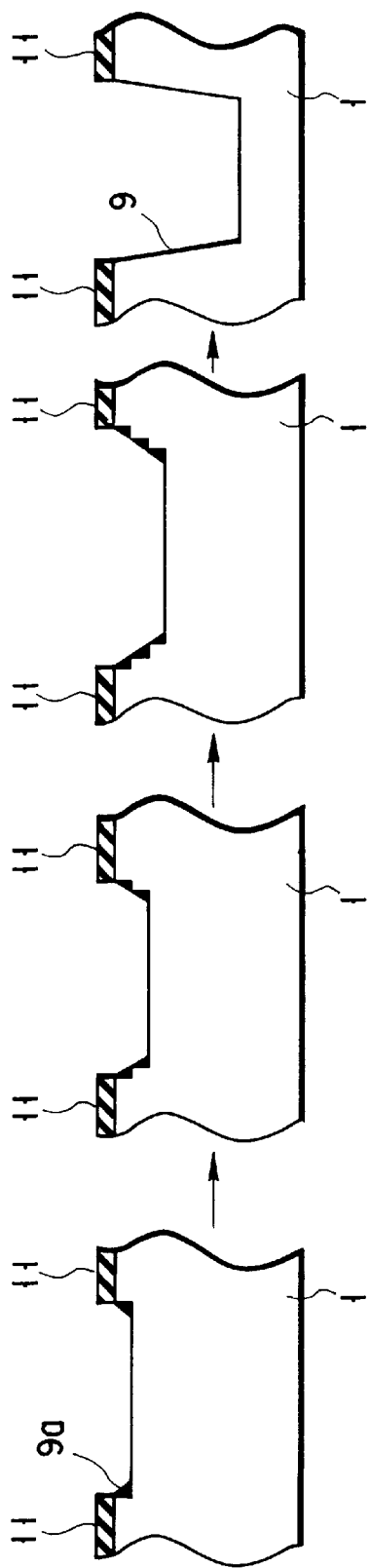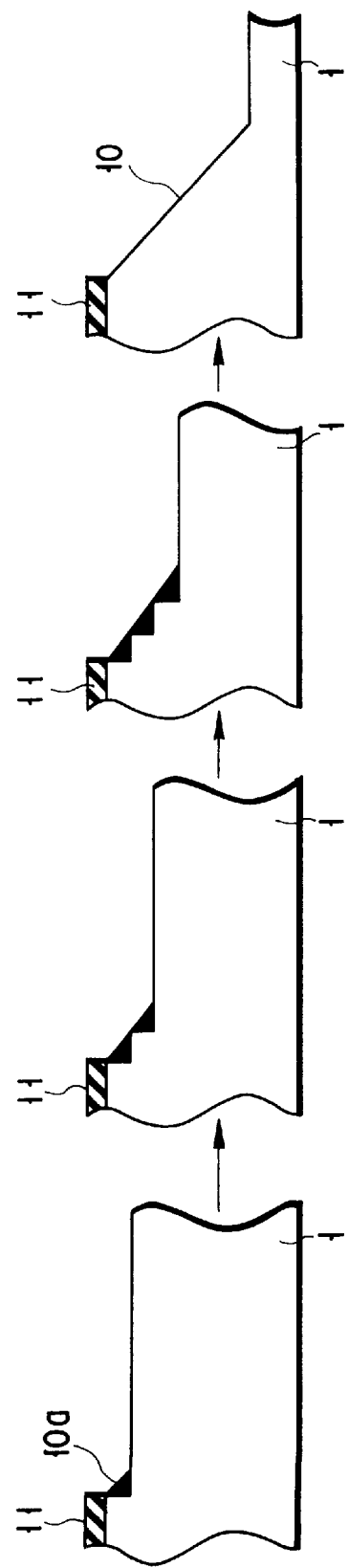
FIG. 2A (PRIOR ART)
FIG. 2B (PRIOR ART)

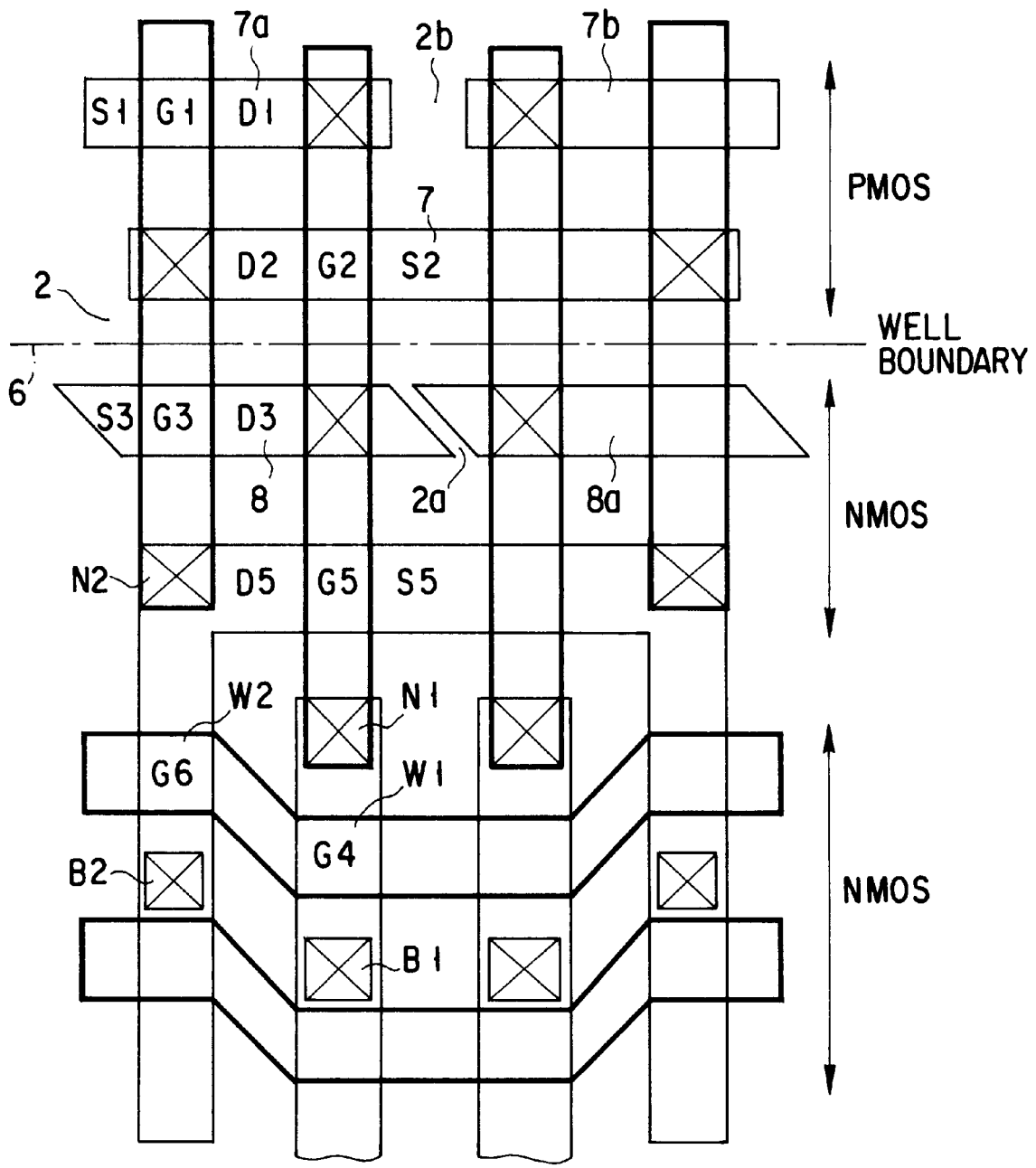
F I G. 9

SEMICONDUCTOR DEVICE AND METHOD OF MANUFACTURING THE SAME

BACKGROUND OF THE INVENTION

The present invention relates to a semiconductor device and a method manufacturing the same, and particularly, to a semiconductor device and a manufacturing method thereof in which a device region is formed by using an insulator filled trench isolation technology.

Conventionally, for example, a method called a local oxidation of silicon has been widely used as a device isolation method used in a semiconductor device. This method will be abbreviated as a LOCOS hereinafter. However, in the LOCOS, an oxide film enters into the periphery of a lower portion of a nitride film used for selective oxidation of a silicon substrate and forms a bird's beak. Therefore, an extra area is required for device isolation so that a miniaturized device isolation region required for manufacturing a large scale semiconductor device with a high density cannot be formed.

An insulator filled trench isolation technology developed in the recent years has attracted considerable attention, as a device isolation method which is suitable for realization of high density and high integration level in the generation of semiconductor devices of a minimum line width 0.25 μm and the later generation of more miniaturized semiconductor devices and which will take the place of the device isolation method using the LOCOS.

Next, explanation will be made of problems in forming device regions isolated from each other. Particularly, for the purpose of application to a CMOS circuit, a problem in forming an insulator filled device isolation region will be specifically explained with reference to FIGS. 1A, 1B, and 1C.

As shown in FIG. 1A, isolation trenches are formed on a silicon substrate 1 by using dry etching, and an insulating film is thereafter filled therein. The surface is subjected to chemical mechanical polishing to form device isolation regions 2 in the silicon substrate. The chemical mechanical polishing will be abbreviated as CMP hereinafter.

Next, as shown in FIG. 1B, the surface of the silicon substrate 1 is coated with a resist film 3, and a N-type impurity is ion-implanted to form a N-well 4.

Subsequently, the N-well 4 ion-implanted is covered with a resist (not shown), and a P-type impurity is ion-implanted into a P-well 5. Thus, a well boundary 6 is formed at the center of the bottom portion of a trench 2.

A P-type source/drain diffusion layer 7 of a P-channel MOS transistor is formed by ion-implantation at device regions of the N-well 4 isolated from each other by a device isolation region 2, as hatched by narrow lines in FIG. 1C. Likewise, an N-type source/drain diffusion layer 8 of an N-channel MOS transistor is formed by ion-implantation at device regions of the P-well 5.

When carrying out pattern formation of the well isolation structure described above, an alignment error of the well boundary 6 sometimes occurs due to the alignment accuracy of photolithography and the dependence on the substrate condition. Therefore, there is a problem that the position of the well boundary 6 shifts by a distance equivalent to the alignment error.

In this case, as long as the side walls 9 of the element separation region 2 are formed at a proper angle close to 90° with respect to the surface of the substrate, the position of the well boundary 6 needs only to be within a range of the bottom width of 2Δx of the trench of the device isolation region, and therefore, an alignment margin of Δx exists from the center to one side. For example, even if the position of the well boundary is shifted by Δx to the right, at least a distance equal to the depth of the trench is maintained between the P-well 5 and the P-type diffusion layer 7. Therefore, there will not occur a punch-through phenomenon in which a large current flows between the P-type diffusion layer 7 and the P-well 5 when a source voltage is applied to the P-type diffusion layer 7.

However, as indicated by a broken line 10 in FIG. 1C, if the inclination of the side wall of the device isolation region 2 is loosened due to some reasons in manufacturing steps, the alignment margin is reduced to $\Delta x_a$ from $\Delta x$. That is, if the position of the well boundary 6 is shifted by $\Delta x_b$ (where $\Delta x_a \leq \Delta x_b \leq \Delta x$) due to the alignment error, the minimum distance between the P-well 5 and the P-type diffusion layer 7 approximates the distance d, so that the punch-through will be caused.

The term of punch-through means the following. Second conductive type regions are provided at both ends of a first conductive type region, and ohmic electrodes are respectively provided for the second conductive type regions. When a voltage is applied to the ohmic electrodes, the built-in potential generated at the boundaries between the first and second conductive type regions decreases and a large current flows between the ohmic electrodes, if the distance between the second conductive type regions is smaller than a certain value.

In case of the example shown in FIG. 1C, if the isolation distance between the device isolation regions 2 is practically shortened as indicated by d in the figure, a large current flows between the P-well 5 and the P-type diffusion layer 7 of the N-well 4 when a source voltage is applied therebetween.

Next, explanation will be made of factors which loosen the inclination of the side wall of the device isolation region 2.

Conventionally, in case of etching a silicon substrate by dry etching to form trenches for device isolation regions, the inclination angle of the side wall of a trench having an open space is loosened more than that of a trench having no open space, and the hem of the side wall tends to be pulled obviously at the bottom of the trench (which will be called hem-pulling hereinafter).

That is, if trenches of device isolation regions are on a plane semiconductor substrate 1 formed by dry etching with use of an etching mask 11 as shown in FIG. 2A, the inclination angle of the side walls 9 is a proper value close to 90°, and fine small device isolation regions can be formed. However, if one of the side walls opposed to each other is situated apart so that an open space is formed in one side of the trench, the inclination angle of the side wall 10 is loosened.

This occurs due to the following grounds. Specifically, in case of dry-etching of silicon, physical and chemical etching of silicon and deposition of reactants formed by the etching take place simultaneously. FIGS. 2A and 2B schematically show the etching procedure of such etching.

As shown in FIG. 2A, when etching a silicon substrate 1 with use of an etching mask 11, reactants 9a are deposited on the peripheral portions of the etching surface and obstacle the etching thereby tapering the side walls 9 of a trench at a certain tapered angle. Since the tapered angle changes depending on the conditions of the dry-etching, the etching conditions should be determined so as to match with the tapered angle in consideration of the phenomenon described above if a desired tapered angle is 85°, for example.

In FIG. 2A, since it is difficult to illustrate influences from the reactants 9a with respect to the tapered angle of the side wall 9 obtained in the final stage, the tapered angles in the intermediate stages are illustrated and exaggerated in the figure.

As shown in FIG. 2B, in case of forming a wide trench having an open space in which one of side walls opposed to each other is arranged apart, the deposition amount of reactants 10a is large with respect to the etching depth. Therefore, the side wall 10 of the trench is looser than the narrow trench shown in FIG. 2A even if same etching conditions are used.

FIG. 3 shows an example of a layout including such an open space. The term of the open space means a region where two device isolation regions 2 extending in the lateral direction in the figure intersect one device isolation region 2a extending in the longitudinal direction in the figure. In case of laying two-dimensionally a large number of device isolation regions, a large number of open spaces are formed. As shown in the plan view of FIG. 3, the side wall 10 facing the open space has a looser inclination angle than the side wall 9 facing no open space, so that hem-pulling is thereby caused.

Each of the device isolation regions 2 and 2a shown in FIG. 3 is filled with an insulating film for device isolation. To clarify particularly the state of hem-pulling caused at a side wall of a trench, the plane shapes of the bottoms of trenches are indicated by continuous lines. The same thing applies to the plane views in FIGS. 4 to 7.

An open space is defined as follows. In FIG. 3, the width of device isolation regions 2 and 2a is designed to be a minimum isolation width $T_{min}$. Supposing that $T_0 > T_{min} + T$ is satisfied where T is the width of device regions 7, 8, 8a, and 8b separated from each other by the device isolation regions 2 and 2a and $T_0$ is the distance between the edges of the device regions 7 and 8b opposed to each other, the isolation trench between the device isolation regions 2a is called an open space of the device region 7.

In the device isolation regions each having an open space, a significant problem is caused particularly in case where a well boundary 6 is formed along the lengthwise direction at the center of the bottom portion of a device isolation region 2 when forming a PN isolation region for a CMOS circuit consisting of a N-well and a P-well as indicated by one-dot chain line in FIG. 3.

A cross-sectional view and a plan view showing a portion to form an open space are shown in FIG. 4, associated with each other. The lower portion of FIG. 4 shows a plan view including a trench of a device isolation region 2a (which will be simply referred to as an open space 2a hereinafter) which forms an open space, and the upper portion of the figure shows a cross-sectional view thereof along a line A—A. In the plan view, the device region 8b opposed to the device region 7 described in the definition of an open space shown in FIG. 3 is omitted.

As shown in FIG. 4, when hem-pulling like the side wall 10 is formed at the side wall 9 of the trench of the device isolation regions 2 (which will be simply called a trench 2) at the open space 2a, a punch-through phenomenon described with reference to FIG. 1C may be caused.

With reference to the A—A cross-sectional view in FIG. 4, the above-mentioned problem will be explained in more details. If the well boundary 6a is shifted by $\Delta x_b$ from a predetermined position on the pattern design to the side of the P-type diffusion layer 7 when making mask alignment, the minimum distance between the P-well 5 and the P-type diffusion layer 7 approximates d. In this case, if the P-type diffusion layer 7 is used as a source of a P-channel MOS transistor forming a CMOS circuit, a source voltage of the CMOS circuit is applied to the P-type diffusion layer 7.

If a large voltage is thus applied between the P-well 5 and the P-type diffusion layer 7, punch-through occurs at the minimum distance d. Note that $\Delta x$ indicated in the plan view is a margin where no open space 2a exists and corresponds to $\Delta x$ explained with reference to FIG. 1C. If a hem-pulling portion as shown at the side wall 10 does not exist at any part of the side wall 9, the problem of punch-through is not caused when the well boundary 6a is shifted to one side from the predetermined position 6 on the pattern design.

If dry-etching conditions are arranged such that the inclination angle of the side wall 10 facing the open space 2a becomes a desired angle (such as 85° described with reference to FIG. 2A) in order to avoid this problem, etching proceeds excessively at the corner portion between the side wall 9 having no open space and the bottom surface of the trench 2, and the cross-sectional shape of the trench 2 becomes anomalous.

If an insulating film to be filled is deposited in the isolation trench 2 thus having an anomalous cross-sectional shape, excellent coverage cannot be attained, leading to a problem that excellent device isolation properties cannot be obtained.

Thus, it is a very difficult problem for existing dry-etching techniques to make the inclination angle of the side walls 9 and 10 correspond to a desired value regardless of presence or absence of an open space 2a.

BRIEF SUMMARY OF THE INVENTION

As has been described above, the conventional insulator filled device isolation technology has a problem that the inclination of the side wall of an isolation trench is loosened at a portion having an open space and the side wall is thereby formed into a shape in which the hem of the side wall appears as if it was pulled. Particularly, in case where a well boundary is formed at the center of an isolation trench to form a CMOS circuit, there is a problem that an alignment error of the well boundary and the hem-pulling synergistically act so that punch-through tends to occur easily between a source/drain diffusion layer in a device region and a well adjacent thereto through the well boundary.

The present invention has been made to solve problems described above, and has an object of hindering occurrence of punch-through between a source/drain diffusion layer in a device region and a well adjacent thereto through a well boundary even when an alignment error of the well boundary occurs, by structurally restricting the hem-pulling of the side wall of an isolation trench, in case where the well boundary is formed at the center of a bottom of the isolation trench.

A semiconductor device according to the present invention comprises first and second device isolation regions formed by filling an insulator in isolation trenches of a semiconductor substrate and by performing flattening thereon, the plane shapes of the first and second device isolation regions are arranged such that an end of the second device isolation region intersects an intermediate portion of the first device isolation region and that the lengthwise direction of the first device isolation region and the lengthwise direction of the second device isolation region intersect obliquely each other, further a well boundary is formed along the lengthwise direction of the first device isolation region at the bottom portion thereof, and first, second, and third device regions are isolated by the first and second device isolation regions.

Specifically, the semiconductor device according to the present invention comprises a first device region which is adjacent to the first device isolation region and is arranged along the lengthwise direction of the first device isolation region in a first conductive type well, and second and third device regions which are adjacent to the first device isolation region and are arranged along the lengthwise direction of the first device isolation region in a second conductive type well with the second device isolation region inserted therebetween, wherein a line intersecting the first device isolation region and extending from the first device region in a direction perpendicular to the well boundary passes at least one of the second and third device regions.

In the semiconductor device according to the present invention, one of a field effect transistor having a second conductive type channel and a bipolar transistor having a second conductive type collector is formed in the first device region constructed as described above, and one of a field effect transistor having a first conductive type channel and a bipolar transistor having a first conductive type is formed in the second and third device regions.

Thus, a complementary circuit consisting of a MOS or a bipolar transistor can be constructed on the first device region and the second and third device regions.

Also, the semiconductor device according to the present invention further comprises a complementary memory cell consisting of first and second P-channel MOS transistors and third to sixth N-channel MOS transistors, wherein the first P-channel MOS transistor and the third N-channel MOS transistor constitute a first complementary inverter connected to a first node, the second P-channel MOS transistor and the fifth N-channel MOS transistor constitute a second complementary inverter connected to a second node, a flip-flop circuit comprising the first and second nodes are constituted by using the first and second complementary inverters, the first node is connected to a first bit line through the fourth N-channel MOS transistor, the second node is connected to a second bit line through the sixth N-channel MOS transistor, gates of the fourth and sixth MOS transistors are connected with a word line, the first device region is arranged in a N-type well and one of the first and second P-channel MOS transistors is formed in the first device region, and the second and third device regions are arranged in a P-type well and one of the third and fifth N-channel MOS transistors is formed in the second and third device regions.

Further, in the semiconductor device according to the present invention, a relation of $Z \leq X+Y$ is satisfied where X is a minimum value of a width of the second and third device regions in a direction perpendicular to the well boundary, Y is a minimum value of a distance between an intersection point at which a line perpendicular to the well boundary intersects a boundary line of the first device region in a side of the first device isolation region and an intersection point at which the line intersects a boundary line of the second or third device region in a side of the first device isolation region, and Z is a maximum value of the distance therebetween.

Also, in the semiconductor device according to the present invention, a relation of $X \geq Y/\cos \theta$ is satisfied where X is a minimum value of a width of the second and third device regions in a direction perpendicular to the well boundary, θ is a sharp angle between a lengthwise direction of the first isolation trench and a lengthwise direction of the second isolation trench, and Y is a minimum distance between boundary lines of the second and third device regions opposed to each other.

By thus constructing the device, punch-through is hardly caused between a diffusion layer in a device region and a well even if the position of a well boundary is shifted due to an alignment error of photolithography, because the hempulling at the bottom portion of an isolation trench is structurally restricted. It is therefore possible to manufacture semiconductor devices with less individual differences, high performance, high reliability, and high reproducibility.

A method of manufacturing a semiconductor device according to the present invention comprises steps of: forming first and second isolation trenches extending in a lengthwise direction in a semiconductor substrate; arranging an end of the second device isolation region in a lengthwise direction thereof, so as to intersect obliquely the lengthwise direction of the first device isolation region, at an intermediate portion of the first device isolation region; forming first and second device isolation regions in the semiconductor substrate by filling an insulator in the first and second isolation trenches and by flattening the first and second isolation trenches; isolating a surface of the semiconductor substrate into first, second, and third device regions by the first and second device isolation regions; forming the first device region along a lengthwise direction of the first device isolation region in a side of the first device isolation region; forming the second and third device regions along the lengthwise direction of the first device isolation region, in another side of the first device isolation region with the second device isolation regions inserted therebetween; further forming at least one well in the semiconductor substrate; and arranging the well so as to have a well boundary perpendicular to a bottom surface of the first isolation trench and extending along a lengthwise direction of the first device isolation trench, wherein a line intersecting the first device isolation region and extended from the first device region in a direction perpendicular to the well boundary passes through at least one of the second and third device regions.

The step of forming the at least one well regions may be performed before the step of forming the first and second isolation trenches in the semiconductor substrate.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2A is a cross-sectional view showing a normal etching state in formation of trenches by conventional dry etching;

FIG. 2B is a cross-sectional view showing an influence from an open space in formation of a trench by conventional dry etching;

FIG. 9 is a view showing a pattern layout of memory cells according to the fourth embodiment of the present invention.

DETAILED DESCRIPTION OF THE INVENTION

In the following, embodiments of the present invention will be specifically explained with reference to the drawings.

Figure 1A:
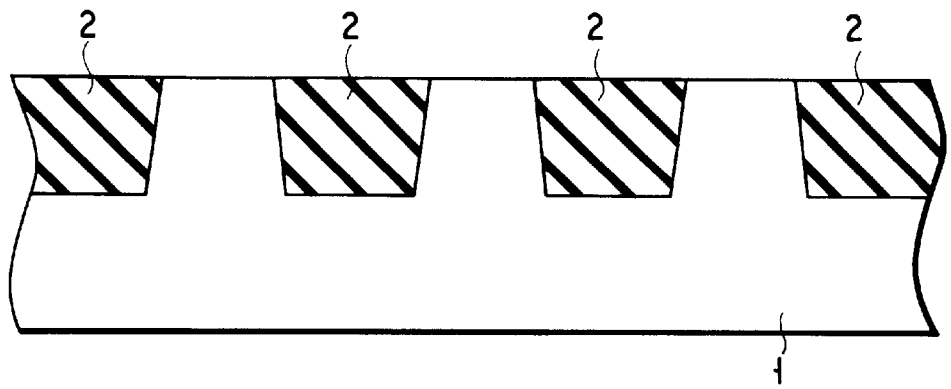
FIG. 1A is a cross-sectional view showing a state where flattening is performed by CMP after trenches are filled with an insulator in a conventional method of trench isolation regions.
Figure 1B:
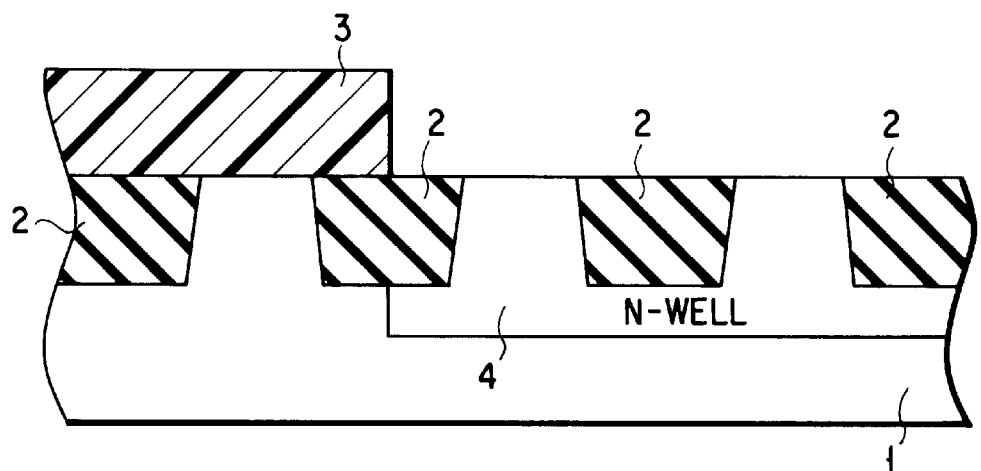
FIG. 1B is a cross-sectional view showing a state where an N-well is subsequently formed with use of a resist mask.
Figure 1C:
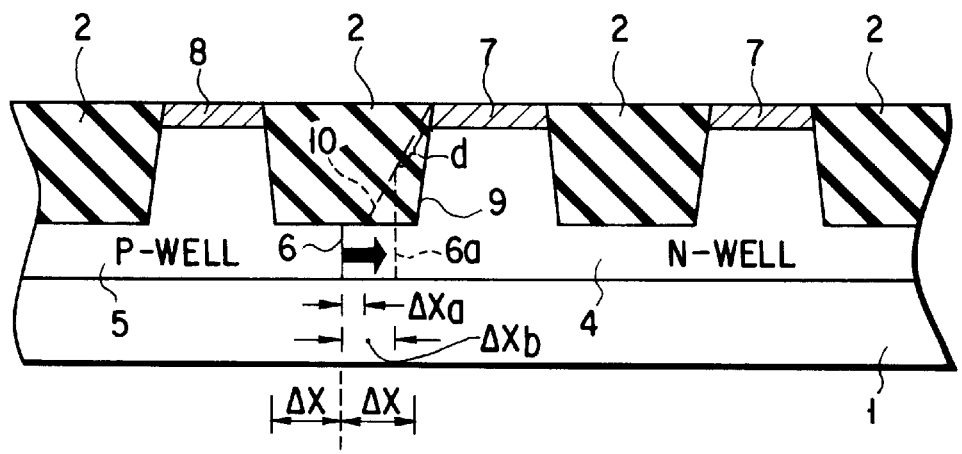
FIG. 1C is a cross-sectional view showing a conventional problem where an alignment error occurs at a well boundary.
Figure 3:
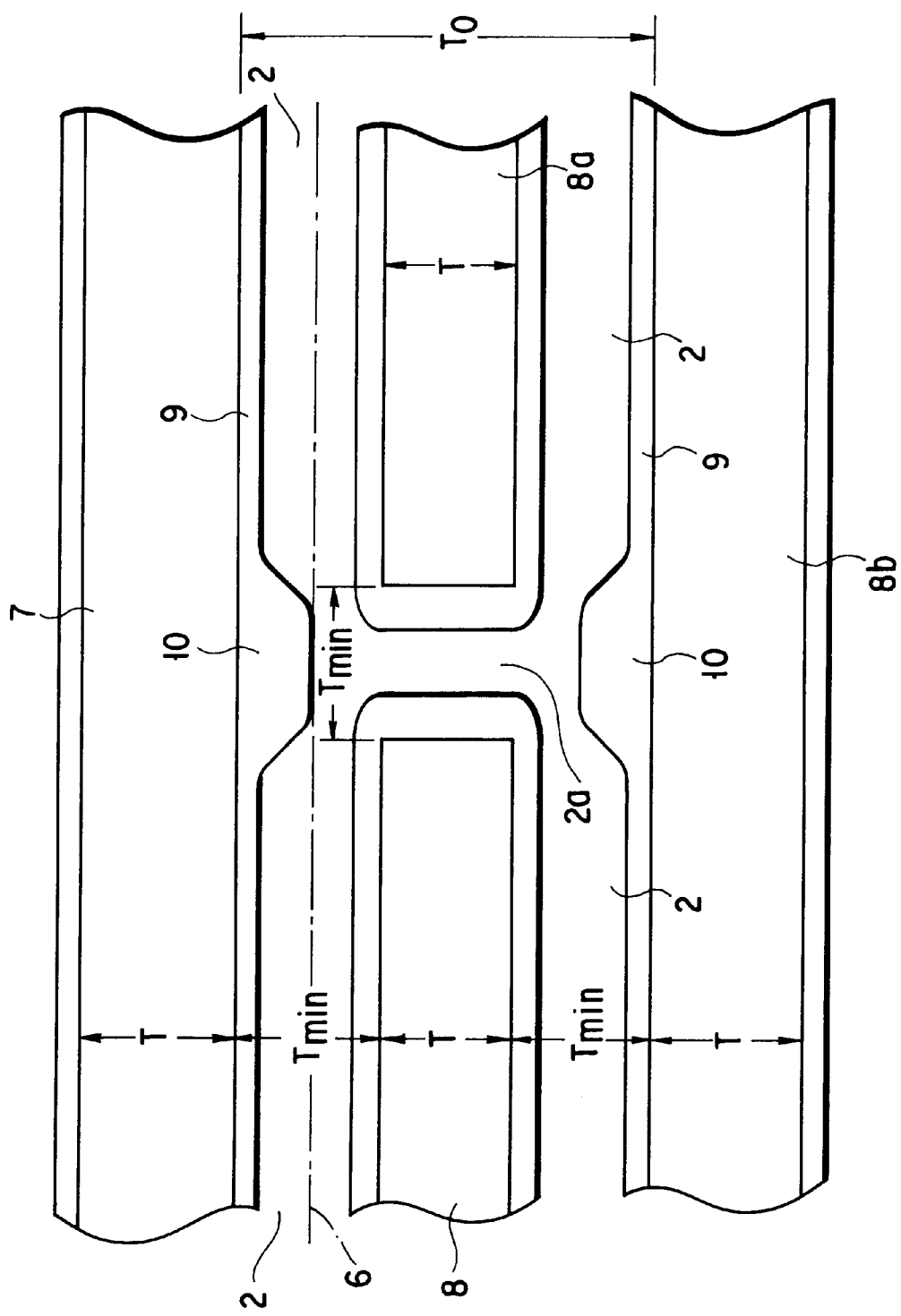
FIG. 3 is a plan view showing definitions of hem-pulling of a side wall of a trench caused at a conventional open space and definition of an open space.
Figure 5:
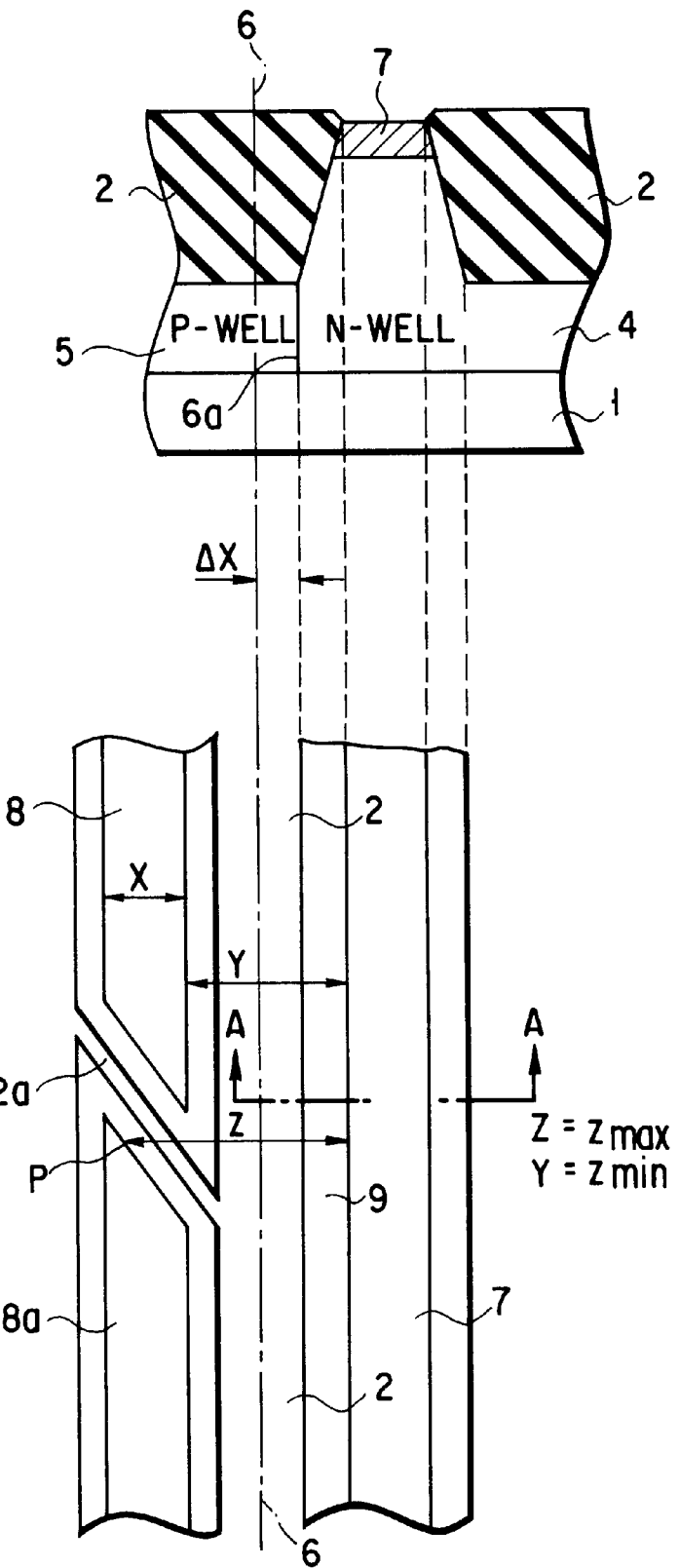
FIG. 5 contains a cross-sectional view and a plan view showing the structure of a device region and a device isolation region according to a first embodiment of the present invention.

FIG. 5 contains a cross-sectional view and a plan view showing the structure of a semiconductor device according to a first embodiment of the present invention. The plan view is illustrated in the lower side of the figure and a A—A cross-sectional view thereof is illustrated in the upper side. The cross-sectional shape of the insulator filled trench isolation structure according to the present invention is basically manufactured in the same procedure as shown in FIGS. 1A, 1B, and 1C. However, the plane shape of the structure is greatly different from that of the conventional insulator filled trench isolation structure. Therefore, those portions of the method of manufacturing a semiconductor device according to the present invention that are related to the cross-sectional shape will be explained with reference to the cross-sectional views in manufacturing steps shown in FIGS. 1A, 1B, and 1C.

In the first embodiment, the manufacturing steps to be performed until the insulator filled structure shown in FIG. 1A are as follows.

A thermal dioxide film (not shown) having a thickness of 20 nm is formed on a N-type silicon substrate 1 parallel to a (100) plane. Further, a polysilicon film (not shown) is deposited by chemical vapor deposition (which will be referred to as only CVD), and the thermal dioxide film, the polysilicon film, and the N-type silicon substrate 1 are etched one after another by photolithography and reactive ion etching method (which will be hereinafter referred to as only a RIE method), to form isolation trenches 2 for device isolation and device regions isolated by the trenches 2. The isolation trenches 2 are filled with a $SiO_2$ film by using again the CVD method.

The thermal dioxide film and the polysilicon film serve to protect device regions. With the polysilicon film used as a stopper, an external $SiO_2$ film is removed and flattened by normal CMP. Thereafter, the polysilicon film is further removed and device isolation regions where a $SiO_2$ film is filled in the N-type silicon substrate 1 are formed as shown in FIG. 1A.

Subsequently, as shown in FIG. 1B, a resist 3 is obtained by pattern formation using photolithography, and an impurity such as P (phosphorus) or the like is doped into a formation region where a N-well is to be formed. Further, the resist 3 is removed and a resist film is formed by pattern formation using photolithography again such that the ion-implanted formation region of the N-well is thereby covered. An impurity such as B (boron), $BF_2$, or the like which has a conductive type opposite to the impurity previously ion-implanted is implanted into a formation region where a P-well is to be formed.

In this manner, a well boundary 6 is formed by mask alignment at a predetermined position on a pattern design, i.e., at the center of the bottom of an isolation trench 2. Note that the step of forming a well needs not always be performed after device isolation regions are formed as described above. A well may previously be formed on a semiconductor substrate, and device isolation regions may thereafter be formed.

Subsequently, thermal annealing is performed for 20 seconds at a temperature of 1000° C. in an atmosphere of $N_2$ by conventional rapid thermal annealing (which will be called RTA hereinafter) to activate the N-well implanted with the impurity. Gate electrodes are formed on the device regions previously covered with a thermal dioxide film. P-type source/drain diffusion layers 7 are formed on the device regions in the N-well 4, by conventional lithography and ion-implantation, and N-type source/drain diffusion layers 8 are formed on the device regions in the P-well 5. Thereafter, electrode formation and the like are carried out to complete devices.

As explained above with reference to FIG. 1C, when an isolation trench 2 has an open space in one side thereof, the side wall of the trench has a loose inclination angle like the side wall 10 in FIG. 1 and the bottom of the trench 2 has a hem-pulling shape. Particularly taken into consideration the P-type source/drain diffusion layer 7 of a device region adjacent to a well boundary 6, the distance d between an edge of a P-well 5 and a P-type source/drain diffusion layer 7 of a device region is decreased so that the structure tends to cause easily punch-through and is not practically useful, if photolithography causes an alignment error at the well boundary 6.

Figure 4:
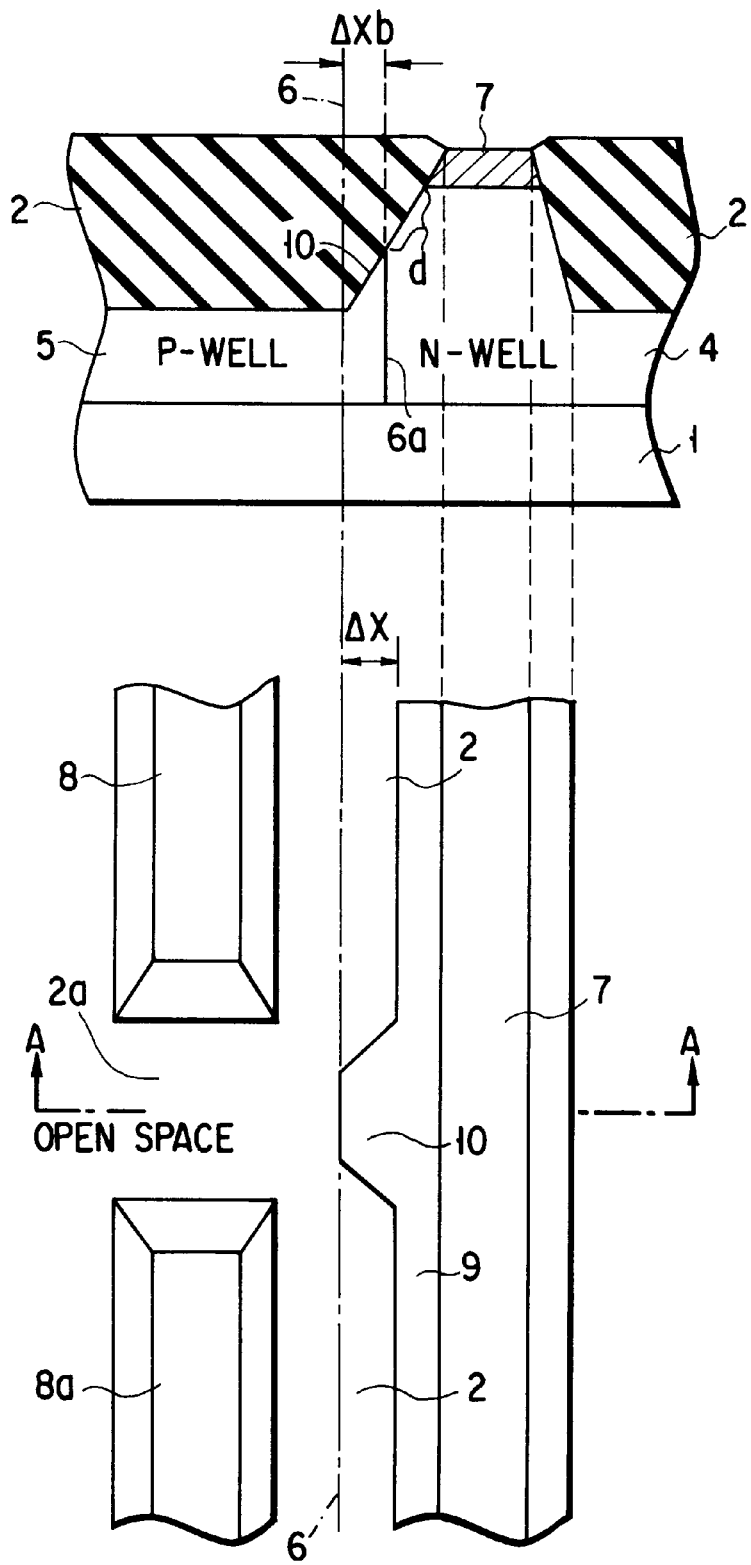
FIG. 4 contains a cross-sectional view and a plan view showing the structure of a conventional device region and a device isolation region including an open space.

According to the first embodiment, to avoid the problem described above, the plane shape of a conventional device isolation region having an open space shown in FIG. 4 is greatly changed like the plane shape shown in FIG. 5.

As shown in the plan view of FIG. 4, for example, when laying out a device region where a P-type source/drain diffusion layer 7 is formed (which will be simply called a device region 7 in the plan view below) and device regions where N-type source/drain diffusion layers 8 and 8a are respectively formed (which will be simply called device regions 8 and 8a in the plan view below) are laid out on a silicon substrate, isolation trenches 2 for isolating the regions from each other and an isolation trench 2a intersecting the trenches 2 at right angles are conventionally formed. In this case, one side wall of each of the trenches 2 forms an open space at the intersecting portion between the trenches 2 and the trench 2a, and the inclination angle of the side wall 10 becomes looser than the inclination angle of the side wall 9 which faces no open space. In this case, a problem of punch-through is caused if a well boundary exists at the bottom portion of the isolation trench 2.

According to the first embodiment, as shown in the plan view in FIG. 5, the isolation trenches 2 and 2a are arranged to intersect obliquely each other, and the plane shapes of the device isolation regions are determined such that influences onto the shape of the side wall 9 from the intersection of the separation trenches 2 and 2a are minimized.

By thus arranging the isolation trenches 2 and 2a so as to intersect each other obliquely, when forming the isolation trenches 2 and 2a by RIE, the open space created by the isolation trench 2a is substantially shielded if the intersecting angle between the isolation trenches 2 and 2a is determined such that the concave portion of the isolation trench 2a cannot be viewed, shielded by the device regions 7 and 8 isolated by the isolation trench 2a, where the isolation trench 2a is viewed over the isolation trench 2 in the direction perpendicular to the well boundary 6 from the device region 7 extending in the lengthwise direction. As a result, it is possible to minimize influences on the shape of the side wall 9 of the isolation trench 2 from the isolation trench 2a.

Specifically, in the plan view in FIG. 5, where a line is extended in the direction perpendicular to the well boundary 6 from the device region 7, the plane shapes of the device regions 7, 8, and 8a are designed such that the line passes through one or both of the device region 8, which is situated at a position symmetrical to the device region 7 with respect to the well boundary 6, and the device region 8a, which is situated at a position symmetrical to the device region 7 with respect to the well boundary 6.

The formation method of forming the plane shapes will be explained more specifically below.

In the plan view in FIG. 5, a line z is extended from the device region 7 in a direction perpendicular to the well boundary 6, and the intersection point at which the line firstly intersects any device isolation region surrounding the periphery of the device region 8 or the device region 8a is P.

If the line z is moved parallel from the lower side of the figure to the upper side thereof, the intersection point P is shifted from the boundary line between the device region 8a and the isolation trench 2 to the boundary line between the device region 8a and the device isolation region 2a, and is further shifted onto the boundary line between the device region 8 and the device isolation region 2 and moves along the boundary line. In this case, it is needless to say that the device regions 8 and 8a are laid out such that the line z always has an intersection point with any of the device regions 8 and 8a.

That is, a maximum value $z_{max}$ is obtained when the line z intersects the isolation trench 2a isolating the device regions 8 and 8a from each other, and a minimum value $z_{min}$ (equal to the distance between the device regions 7 and 8 and 8a) in places other than the trench 2a. In this time, $z_{max}=z$ and $z_{min}=Y$ are set. Also, as shown in the plan view in FIG. 5, if the width in the vertical direction is equal to the well boundary 6 between the device regions 8 and 8a where the width is expressed by X, designing is performed so as to satisfy a relation of $Z \leq X+Y$. If the width in the vertical direction is not equal to the well boundary 6 between the device regions 8 and 8a, the minimum value of the width is expressed by X.

By making arrangements described above, it is possible to reduce structurally hem-pulling caused at the side wall 9. Therefore, as shown in the cross-sectional view in FIG. 5, if the well boundary 6 is shifted to the position indicated by the reference 6a from a predetermined position on design, i.e., if there occurs a large error which reaches a limit value $\Delta x$ of the alignment margin of photolithography, the distance between the source/drain diffusion layer 7 of the device region and the well boundary 5a is maintained at a sufficient value (which is at least the depth of the isolation trench 2) and there is no risk of causing punch-through. Therefore, it is possible to achieve a semiconductor device which attains high reliability by reducing increases of leakage currents and unevenness in properties.

Next, a second embodiment of the present invention will be explained on the basis of FIGS. 6A and 6B. In the second embodiment, in case of forming device regions 7, 8, and 8a isolated from each other by isolation trenches 2 and 2a as shown in FIG. 6A where a line Za is extended from the device region 7 in the direction perpendicular to the well boundary 6, the device regions 8 and 8a are laid out such that the line Za passes through either the device region 8 or 8a or passes through both the device regions 8 and 8a.

Figure 6A:
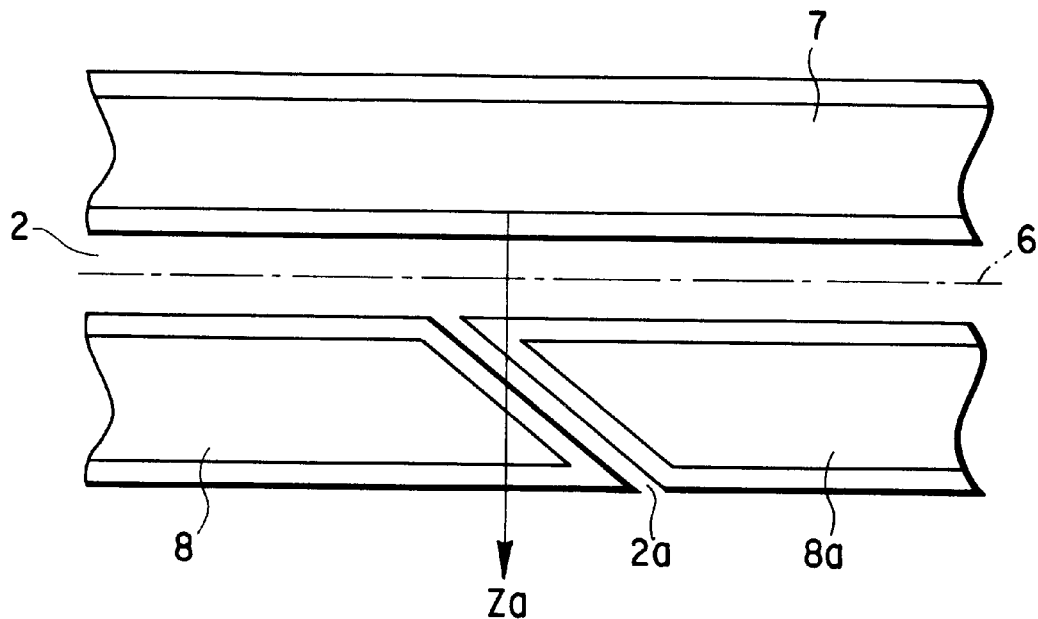
FIG. 6A is a plan view showing a method of laying out a device region and an element separate region according to a second embodiment of the present invention.

The condition described above is equivalent to the condition described in the first embodiment, in case of the plane shapes shown in FIG. 6A. However, this condition also easily applies to, for example, a case in which the plane shape of the isolation trench 2a isolating the device regions 8 and 8a from each other is formed in a step-like shape as shown in FIG. 6B, the isolation trench 2a has a total lengthwise direction which totally intersects obliquely the isolation trench 2.

By making the arrangements described above, the number of data items necessary for pattern design of the device regions 8 and 8a can be reduced to be smaller than in the case where the isolation trench 2a is inclined linearly as shown in FIG. 6A.

Figure 6B:
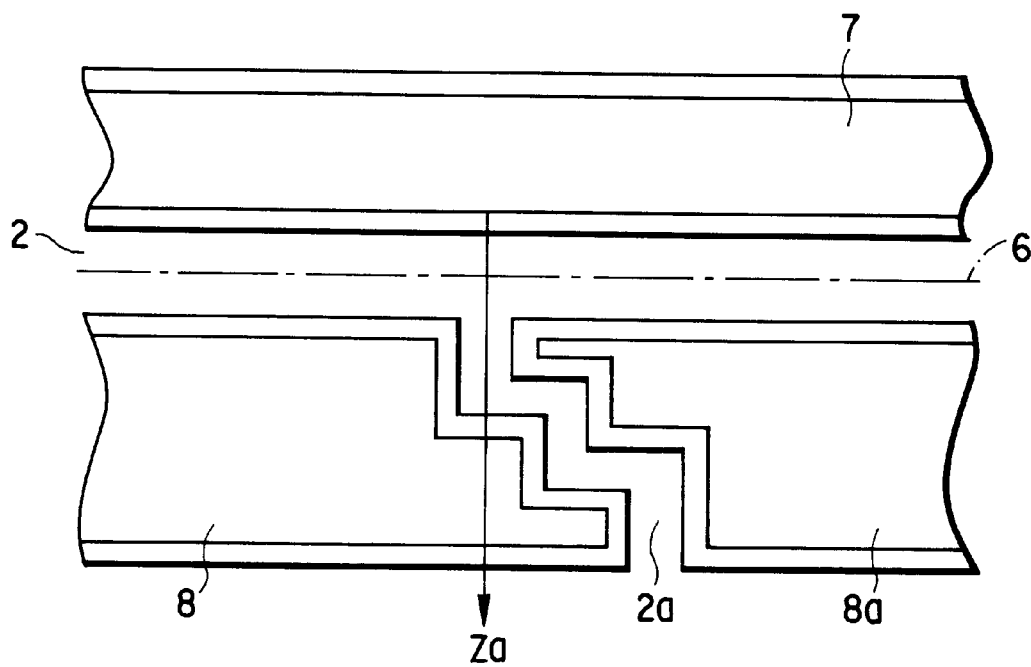
FIG. 6B is a plan view showing a modification of a method of laying out a device region and a device isolation region according to the second embodiment.

Even if the isolation trench 2a is formed in a step-like shape, even when an isolation trench 2a exists on one side wall of the trench 2 which has a well boundary 6 at its bottom portion along the lengthwise direction thereof, hem-pulling caused at the other side wall of the isolation trench 2 can be structurally restricted by arranging a line Za so as to pass through either of the device region 8 or the device region 8a or pass through both of the device regions 8 and 8a, as shown in FIG. 6B, where the line Za is a line extended in the direction perpendicular to the well boundary 6 from the device region 7.

Next, a third embodiment of the present invention will be explained on the basis of FIG. 7. In the first and second embodiments, the isolation trenches 2 and 2a are connected obliquely with each other, and conditions are determined such that the structure does not cause a portion which substantially serves as an open space with respect to the isolation trench 2. However, in the third embodiment, the structure is defined from a different view point, as a condition which is simpler on pattern design.

Figure 7:
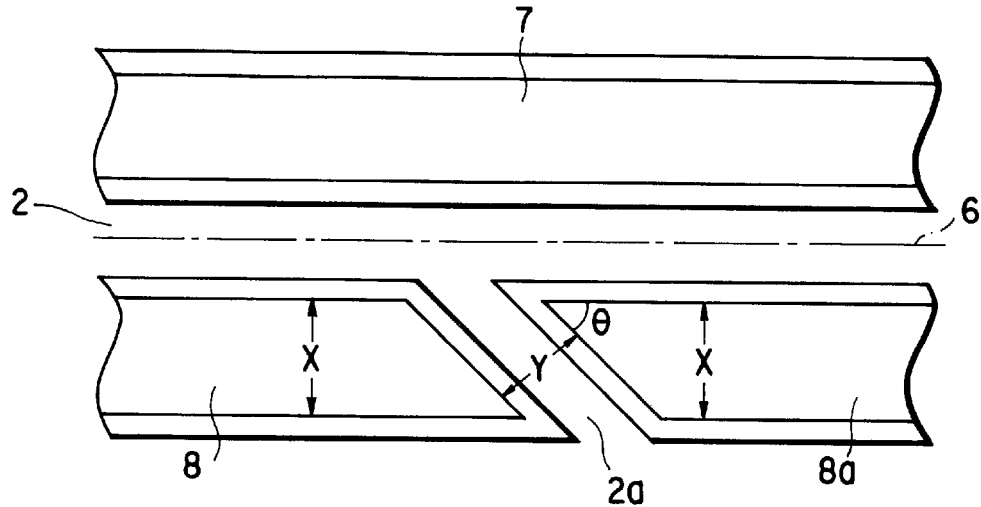
FIG. 7 is a plan view showing another method of laying out a device region and a device isolation region according to a third embodiment of the present invention.

As shown in FIG. 7, such an isolation trench 2a is formed that has a well boundary 6 along the bottom portion of the trench 2 and has an end obliquely intersecting an intermediate portion of the isolation trench 2.

Device regions 7, 8, and 8a isolated from each other by the isolation trenches 2 and 2a are formed. In this time, the pattern layout is formed so as to satisfy a relation of $X \geq Y/\cos \theta$, supposing that the device regions 8 and 8a have an equal width X, the minimum distance between the device regions 8 and 8a opposed each other with the isolation trench 2a interposed therebetween is Y, and a sharp angle formed between one of opposed edges of the device regions 8 and 8a and another edge thereof parallel to the well boundary 6 is $\theta$.

In this case, if the device regions 8 and 8a do not have an equal width, the minimum value of the width is expressed as X like in the first embodiment.

By thus arranging the isolation trench 2a so as to intersect one of the side walls of the isolation trench 2 having the well boundary along the bottom portion, the hem-pulling caused at the other side wall of the isolation trench 2 can be structurally restricted.

Although the condition suggested in the third embodiment is equivalent to the condition suggested in the first embodiment, the conditional relation of the third embodiment defined by the angle $\theta$, the width of the device regions 8 and 8a, and the minimum distance is sometimes rather useful on mask pattern design.

Figure 8:
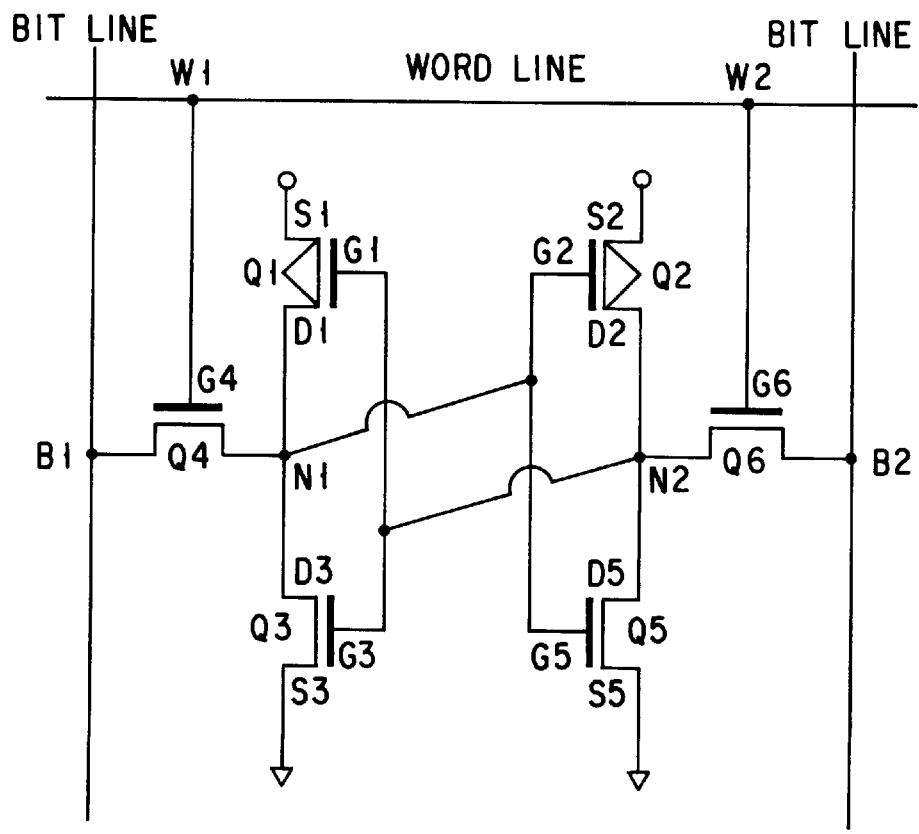
FIG. 8 is a view showing a circuit configuration of a memory cell according to a fourth embodiment of the present invention.

Next, a semiconductor device according to a fourth embodiment will be explained on the basis of FIG. 8. FIG. 8 shows a circuit configuration of a memory cell of a static random access memory constructed in a CMOS circuit.

The memory cell shown in FIG. 8 comprises P-channel MOS transistors Q1 and Q2, N-channel MOS transistors Q3, Q4, Q5, and Q6, first and second bit lines, and a word line. The transistors Q1 and Q3 are connected by a first node N1 thereby forming a first CMOS inverter, and the transistors Q2 and Q5 are connected by a node N2 thereby forming a second CMOS inverter. The first and second CMOS inverters are respectively connected with outputs from the second and first CMOS inverters, thereby forming a flip-flop circuit. The node N1 is connected to the first bit line through the first connection transistor Q4, and the node N2 is connected to the second bit line through the second connection transistor Q6.

An all-CMOS semiconductor memory device having memory cells each consisting of a CMOS circuit has a feature of least power dissipation. However, a number of device isolation regions for N-wells, P-well, and others must be formed to construct a CMOS circuit.

Next, with reference to FIG. 9, explanation will be made of an example in which a countermeasure of the present invention against an open space at an isolation trench along a well boundary is applied to a pattern layout of the memory cells described above. In FIG. 9, same components are denoted by same reference symbols.

In FIG. 9, device regions surrounded by narrow continuous lines are isolated by device isolation regions filled between the device regions. Portions surrounded by thick continuous lines are gates made of polysilicon and lead wires from the gates. The device regions are ion-implanted at a high impurity density, as source/drain regions, and therefore, are also used as wires connecting devices like the polysilicon gates.

In the figure, the intersection points indicated by cross marks are contact holes forming connection points between source/drain lead wires and gate lead wires made of polysilicon. References B1 and B2 are contact holes for connecting nodes N1 and N2 with first and second bit lines (not shown) through connection transistors Q4 and Q6. In the pattern layout of memory cells shown in FIG. 9, the bit lines are arranged along the longitudinal direction on the contact holes B1 and B2 with an insulating film interposed therebetween.

In FIG. 9, the device regions in the PMOS side with respect to the well boundary 6 are respectively provided on N-wells. The device regions in the NMOS side with respect to the well-boundary 6 are respectively provided on the P-wells. Each of the gate electrodes G1 to G6 of the PMOS and NMOS is formed on an intersection point between a device region and a gate wire. In the PMOS and NMOS sides, the source/drain regions are respectively formed by ion-implanting P-type impurity ions and N-type impurity ions at a high density, into the entire device regions, with the gate electrodes thereof used as masks.

References W1 and W2 are connection points between the word line and the gate electrodes G4 and G6, and the gate electrodes and the word line are formed as a wire integrally made of polysilicon. In the memory cell array of a static random access memory, memory cells each arranged described are extensionally associated with adjacent memory cells as if each memory cell was a mirror copy of an adjacent memory cell in both the longitudinal and lateral directions.

In the pattern layout shown in FIG. 9, the countermeasure of the present invention against an open space is applied to such a portion that consists of a device isolation region where an insulator is filled in an isolation trench 2 having a well boundary 6 along a bottom surface and a device isolation region where an insulator is filled in an isolation trench obliquely intersecting the former device isolation region in the NMOS side.

Conventionally, the plane shapes of device regions 8 and 8a have an open space 2b in front of a device region 7 like the regions 7a and 7b in the PMOS side. However, if the plane shapes are arranged such that the isolation trench 2a is inclined as indicated by the device regions 8 and 8a shown in FIG. 9 and triangular regions are respectively extended from both ends of the device regions 8 and 8a, the hem-pulling at the side wall of the isolation trench 2 is restricted at the bottom portion of the isolation trench 2 where the well boundary 6 exists, and the punch-through between the P-type source/drain diffusion layer of the device region 7 and the P-well in the NMOS side can be avoided.

In FIG. 9, the transistor Q2 shown in FIG. 8 is formed at the device region 7 and the transistor Q3 is formed at the device region 8. However, the transistor Q2 in FIG. 8 may be formed at the device region 7 and the transistor Q5 in FIG. 8 may be formed at the device region 8. By using the pattern layout as described above, the yield and reliability of a static random access memory can be greatly improved.

The advantage of the great improvement in the yield and reliability of a CMOS circuit is not always limited to an all-CMOS semiconductor memory device using a CMOS for each memory cell. The same advantage can be obtained in case of a semiconductor memory device using a CMOS for a peripheral circuit. Also, the same advantage is not always limited to a semiconductor memory device but can be obtained in case of another semiconductor device consisting of a CMOS circuit or a bipolar complementary circuit.

As for the device isolation structures shown in the first to fourth embodiments, conditions for preventing formation of open spaces have been cited with respect to only the simplest and most basic examples thereof. However, the present invention is not limited to the above embodiments. The present invention can be modified variously within the scope of the subject matter of the invention.

As has been described above, if a structure comprising the device isolation regions according to the present invention is used, an alignment error of photolithography occurs at a well boundary and the well boundary is shifted, hem-pulling of a side wall of an isolation trench conventionally caused at an open space of an isolation trench can be restricted, and punch-through between a source/drain diffusion layer and well adjacent thereto with a well boundary interposed therebetween can be avoided. Therefore, increases of leakage currents and unevenness of properties can be sufficiently restricted so that a semiconductor device having excellent performance and high reliability can be manufactured with a high yield.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising first and second device isolation regions formed by filling an insulator in isolation trenches of a semiconductor substrate and by performing flattening, and a well boundary perpendicular to a bottom surface of the first device isolation region and extending along a lengthwise direction of the first device isolation region, wherein an end of the second device isolation region in a lengthwise direction thereof obliquely intersects the lengthwise direction of the first device isolation region, at an intermediate portion of the first device isolation region, there are provided first, second, and third device regions isolated by the first and second device isolation regions, the first device region is adjacent to the first device isolation region and is arranged along the lengthwise direction of the first device isolation region in a first conductive type well, the second and third device regions are adjacent to the first device isolation region and is arranged along the lengthwise direction of the first device isolation region in a second conductive type well with the second device isolation region inserted therebetween, the second and third device regions are arranged such that a line intersecting the first device isolation region and extended from the first device region in a direction perpendicular to the well boundary passes at least one of the second and third device regions, at least one of a field effect transistor having a second conductive type channel and a bipolar transistor having a second conductive type collector is formed in the first device region, and at least one of a field effect transistor having a first conductive type channel or a bipolar transistor having a first conductive type collector is formed in the second and third device regions.

2. A device according to claim 1, further comprising a complementary memory cell consisting of first and second P-channel MOS transistors and third to sixth N-channel MOS transistors, wherein the first P-channel MOS transistor and the third N-channel MOS transistor constitute a first complementary inverter connected to a first node, the second P-channel MOS transistor and the fifth N-channel MOS transistor constitute a second complementary inverter connected to a second node, a flip-flop circuit comprising the first and second nodes are constituted by using the first and second complementary inverters, the first node is connected to a first bit line through the fourth N-channel MOS transistor, the second node is connected to a second bit line through the sixth N-channel MOS transistor, gates of the fourth and sixth MOS transistors are connected with a word line, the first device region is arranged in a N-type well and one of the first and second P-channel MOS transistors is formed in the first device region, and the second and third device regions are arranged in a P-type well and one of the third and fifth N-channel MOS transistors is formed in the second and third device regions.

3. A device according to claim 1, wherein a relation of $Z \leq X+Y$ is satisfied where X is a minimum value of a width of the second and third device regions in a direction perpendicular to the well boundary, Y is a minimum value of a distance between an intersection point at which a line perpendicular to the well boundary intersects a boundary line of the first device region in a side of the first device isolation region and an intersection point at which the line intersects a boundary line of the second or third device region in a side of the first device isolation region, and Z is a maximum value of the distance therebetween.

4. A device according to claim 1, wherein a relation of $X \geq Y/\cos \theta$ is satisfied where X is a minimum value of a width of the second and third device regions in a direction perpendicular to the well boundary, $\theta$ is a sharp angle between a lengthwise direction of the first isolation trench and a lengthwise direction of the second isolation trench, and Y is a minimum distance between boundary lines of the second and third device regions opposed to each other.

5. A method of manufacturing a semiconductor memory device, comprising steps of:

forming first and second isolation trenches extending in a lengthwise direction in a semiconductor substrate;

arranging an end of the second device isolation region in a lengthwise direction thereof, so as to intersect obliquely the lengthwise direction of the first device isolation region, at an intermediate portion of the first device isolation region;

forming first and second device isolation regions in the semiconductor substrate by filling an insulator in the first and second isolation trenches and by flattening the first and second isolation trenches;

isolating a surface of the semiconductor substrate into first, second, and third device regions by the first and second device isolation regions;

forming the first device region along a lengthwise direction of the first device isolation region in a side of the first device isolation region;

forming the second and third device regions along the lengthwise direction of the first device isolation region, in another side of the first device isolation region with the second device isolation regions inserted therebetween;

further forming at least one well in the semiconductor substrate; and arranging the well so as to have a well boundary perpendicular to a bottom surface of the first isolation trench and extending along a lengthwise direction of the first device isolation trench, wherein a line intersecting the first device isolation region and extended from the first device region in a direction perpendicular to the well boundary passes through at least one of the second and third device regions.

6. A method according to claim 5, wherein the step of forming the at least one well regions is performed before the step of forming the first and second isolation trenches in the semiconductor substrate.

* * * * *